(12) United States Patent
Miyanaga et al.

(10) Patent No.: US 12,266,734 B2
(45) Date of Patent: Apr. 1, 2025

(54) INFRARED SENSOR AND MANUFACTURING METHOD FOR THE SAME

(71) Applicant: NS Materials Inc., Fukuoka (JP)

(72) Inventors: Akiharu Miyanaga, Fukuoka (JP); Tetsuji Ito, Fukuoka (JP)

(73) Assignee: TOPPAN INC., Tokyo (JP)

( * ) Notice: Subject to any disclaimer, the term of this patent is extended or adjusted under 35 U.S.C. 154(b) by 0 days.

(21) Appl. No.: 17/273,895

(22) PCT Filed: Sep. 11, 2019

(86) PCT No.: PCT/JP2019/035713
§ 371 (c)(1),
(2) Date: Mar. 5, 2021

(87) PCT Pub. No.: WO2020/054764
PCT Pub. Date: Mar. 19, 2020

(65) Prior Publication Data
US 2021/0234056 A1    Jul. 29, 2021

(30) Foreign Application Priority Data

Sep. 12, 2018   (JP) ................................. 2018-170491

(51) Int. Cl.
*H01L 31/101* (2006.01)
*H01L 31/0256* (2006.01)
*H01L 31/0352* (2006.01)

(52) U.S. Cl.
CPC ........ *H01L 31/101* (2013.01); *H01L 31/0256* (2013.01); *H01L 31/035218* (2013.01)

(58) Field of Classification Search
CPC ............... H01L 31/101; H01L 31/0256; H01L 31/035218; H01L 31/024; H01L 31/03046;
(Continued)

(56) References Cited

U.S. PATENT DOCUMENTS 6,632,701 B2 * 10/2003 Merrill .............. H01L 27/14621
   438/70
6,730,934 B2 *  5/2004 Yamada .............. H01L 31/1804
   257/E33.005
(Continued)

FOREIGN PATENT DOCUMENTS

CN    103059868    4/2013
CN    105493295    4/2016
(Continued)

OTHER PUBLICATIONS

Hines et. al. "Colloidal PbS Nanocrystals with Size-Tunable Near-Infrared Emission . . . ", Ad. Mater. 2003, I5, No. 21 , 1844-1848, Nov. 2003 , Wiley-VCH (Year: 2003).*
(Continued)

*Primary Examiner* — Sitaramarao S Yechuri
(74) *Attorney, Agent, or Firm* — Greenblum and Bernstein, P.L.C.

(57) ABSTRACT

An object is to provide an infrared sensor with a quantum dot optimized. The present invention provides an infrared sensor (1) including a light absorption layer (5) that absorbs an infrared ray, wherein the light absorption layer includes a plurality of spherical quantum dots (21). Alternatively, the present invention provides an infrared sensor including a light absorption layer that absorbs an infrared ray, wherein the light absorption layer includes a plurality of quantum dots and the quantum dot includes at least one kind of PbS, PbSe, CdHgTe, $Ag_2S$, $Ag_2Se$, $Ag_2Te$, $AgInSe_2$, $AgInTe_2$, $CuInSe_2$, $CuInTe_2$, and InAs.

1 Claim, 6 Drawing Sheets

(58) Field of Classification Search
CPC ............. H01L 31/109; H01L 31/03845; H01L 27/14669; G01J 5/0853; G01J 5/12; G01J 5/28; G01J 1/02
See application file for complete search history.

(56) References Cited

U.S. PATENT DOCUMENTS

| | | |
|---|---|---|
| 2005/0236556 A1 | 10/2005 | Sargent et al. |
| 2009/0152664 A1* | 6/2009 | Klem ................. H01L 27/14603 257/466 |
| 2009/0294890 A1* | 12/2009 | Graetzel .............. H01G 9/2072 257/440 |
| 2011/0240106 A1* | 10/2011 | Tang ..................... C09K 11/662 257/14 |
| 2011/0297217 A1* | 12/2011 | Barkhouse .......... H01L 31/0725 977/774 |
| 2012/0223291 A1 | 9/2012 | Klem et al. |
| 2012/0273719 A1* | 11/2012 | Tangirala ............. C04B 35/632 977/773 |
| 2013/0092885 A1 | 4/2013 | Cho et al. |
| 2014/0220724 A1* | 8/2014 | Duty ................. H01L 21/02656 438/69 |
| 2014/0319525 A1* | 10/2014 | Landry ............... H01L 31/0296 257/53 |
| 2014/0326949 A1 | 11/2014 | Xu et al. |
| 2015/0333201 A1* | 11/2015 | Sargent ................... H01L 31/06 136/250 |
| 2016/0211392 A1* | 7/2016 | So .......................... H01L 31/101 |
| 2016/0293783 A1 | 10/2016 | Shiomi et al. |
| 2017/0271604 A1 | 9/2017 | Brown et al. |
| 2019/0006541 A1 | 1/2019 | So et al. |
| 2019/0165192 A1* | 5/2019 | Hosokawa ............. H10K 30/35 |
| 2021/0025761 A1* | 1/2021 | Altenbeck ............. G01J 5/0804 |

FOREIGN PATENT DOCUMENTS

| | | | |
|---|---|---|---|
| CN | 105493295 A * | 4/2016 | ................ G01J 1/44 |
| JP | 2009-231364 | 10/2009 | |
| JP | 2012-019083 | 1/2012 | |
| JP | 2013-506302 | 2/2013 | |
| JP | 2014-093327 | 5/2014 | |
| JP | 2015-505860 | 2/2015 | |
| JP | 2015-128105 | 7/2015 | |
| JP | 2015-162478 | 9/2015 | |
| JP | 2015-189636 | 11/2015 | |
| JP | 2016-532301 | 10/2016 | |
| JP | 2017-516320 | 6/2017 | |
| JP | 2018-107465 | 7/2018 | |
| KR | 10-2016-0078954 | 7/2016 | |
| KR | 20180008099 A * | 1/2018 | |
| KR | 10-2018-0018660 | 2/2018 | |
| WO | WO-0171812 A1 * | 9/2001 | ............. B82Y 10/00 |
| WO | WO-2012018649 A2 * | 2/2012 | ........ H01L 31/02168 |
| WO | WO-2018122664 A1 * | 7/2018 | .......... C07D 491/048 |

OTHER PUBLICATIONS

McDonal et al. "Solution-processed PbS quantum dot infrared photodetectors and photovoltaics", Feb. 2005 Nature, materials, vol. 4, pp. 138-140 (Year: 2005).*

Langevin MA, Pons T, Ritcey AM, Allen CN. Near-Infrared Emitting AgInTe2 and Zn—Ag—In—Te Colloidal Nanocrystals. Nanoscale Res Lett. Dec. 2015;10(1):951. doi: 10.1186/s11671-015-0951-y. Epub Jun. 5, 2015. PMID: 26058512; PMCID: PMC4477004. (Year: 2015).*

International Search Report (ISR) from International Searching Authority (Japan Patent Office) in International Pat. Appl. No. PCT/JP2019/035713, dated Nov. 5, 2019, along with an English language translation.

Extended European Search Report from European Patent Office (EPO) issued for European Patent Appl. No. 19859093.7, dated May 13, 2022.

Alberto Maulu et al.: "Strongly-coupled PbS QD solids by doctor blading for IR photodetection", RSC Advances, vol. 6, No. 83, Aug. 8, 2016, pp. 80201-80212.

Miri S. et al.: "Fabrication of fast and sensitive IR-detectors based on PbS quantum dots passivated by organic ligands", Physica Status Solidi. A: Applications and Materials Science, vol. 210, No. 2, Nov. 26, 2012, pp. 420-424.

Office Action from Korean Intellectual Property Office in Korean Pat. Appl. No. 10-2021-7006900, dated Feb. 4, 2024, together with an English language translation.

Office Action from Japan Patent Office (JPO) in Japanese Patent Appl. No. 2020-546054, dated May 14, 2024, together with an English language translation.

Office Action from Japan Patent Office (JPO) in Japanese Patent Appl. No. 2020-546054, dated Sep. 10, 2024, together with an English language translation.

* cited by examiner

INFRARED SENSOR AND MANUFACTURING METHOD FOR THE SAME

TECHNICAL FIELD

The present invention relates to an infrared sensor capable of detecting an infrared ray, and a manufacturing method for the same.

BACKGROUND ART

Patent Literature 1 below has disclosed the invention about a quantum dot type infrared detector. The infrared detector according to Patent Literature 1 includes a stack structure including a quantum dot layer including a plurality of quantum dots and intermediate layers having the quantum dot layer held therebetween.

According to Patent Literature 1, the quantum dots are micro-processed into an island shape. The quantum dots are formed of InAs.

CITATION LIST

Patent Literature

[Patent Literature 1] Japanese Laid-Open Patent Publication No. 2015-162478

SUMMARY OF INVENTION

Technical Problem

However, the infrared sensor in which the quantum dots are micro-processed into the island shape as described in Patent Literature 1 easily causes problems that adjustment for the micro-processing or the manufacturing process becomes complicated and moreover, the manufacturing cost increases.

In addition, depending on the growing degree of the quantum dots that are micro-processed into the island shape, for example, the decrease in sensitivity or variation has been concerned.

The present invention has been made in view of such circumstances, and an object is to provide an infrared sensor with the quantum dots optimized, and a manufacturing method for the same.

Solution to Problem

The present invention provides an infrared sensor including a light absorption layer that absorbs an infrared ray, wherein the light absorption layer includes a plurality of quantum dots, and the quantum dot is spherical.

In addition, the present invention provides a manufacturing method for an infrared sensor including a light absorption layer that absorbs an infrared ray. The manufacturing method includes a step of forming a quantum dot by a liquid-phase synthesis method, and a step of forming the light absorption layer by applying a composition including a plurality of the quantum dots.

Advantageous Effects of Invention

In the infrared sensor according to the present invention, the structure of the light absorption layer including the quantum dot can be optimized.

DESCRIPTION OF EMBODIMENT

One embodiment of the present invention (hereinafter referred to as "embodiment" simply) is hereinafter described in detail. Note that the present invention is not limited to the embodiment below, and various changes are possible within the range of the concept thereof.

Conventionally, in an infrared sensor including a light absorption layer including quantum dots, the light absorption layer is formed by micro-processing the quantum dots into an island shape through a micro-processing technique, for example, by epitaxial growth of the quantum dots. This structure, however, has problems that the roughness of the light absorption layer easily increases and the variation in sensitivity or the decrease in sensitivity is caused. In view of this, as a result of eager studies, the present inventors have developed an infrared sensor capable of suppressing the variation in sensitivity and improving the sensitivity by forming the quantum dots included in the light absorption layer into a spherical shape by a liquid-phase synthesis method, for example, without using the aforementioned micro-processing technique. A structure of the infrared sensor according to the present embodiment is described below.

Figure 1:
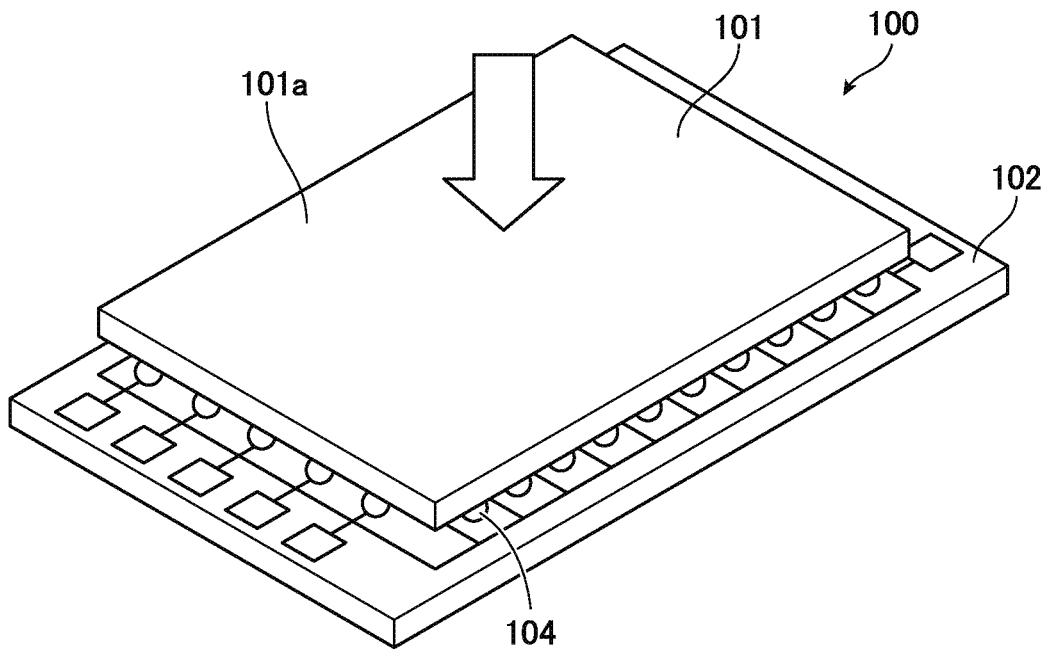
FIG. 1 is a perspective view of an infrared image capture device including an infrared sensor according to the present embodiment.

FIG. 1 is a perspective view of an infrared image capture device including the infrared sensor according to the present embodiment. As illustrated in FIG. 1, an infrared image capture device 100 includes an infrared sensor 101 and a circuit board 102.

As illustrated in FIG. 1, the infrared sensor 101 is provided on the circuit board 102 by flip-chip bonding through a plurality of bumps 104.

For example, the infrared sensor 101 includes a quantum dot infrared photo-detector (QDIP) array in which a plurality of pixels are arranged. The bump 104 is provided for each pixel. Note that in the present embodiment, the number of pixels is not limited to a particular value.

A surface 101a of the infrared sensor 101 illustrated in FIG. 1 is a light reception surface. When an infrared ray is delivered to the surface 101a from a direction of an arrow, carriers confined in the quantum dot in the infrared sensor 101 are excited and the infrared ray is detected as photocurrent on the circuit board 102 side.

In the present embodiment, an image sensor that can detect an infrared ray can be achieved. The application of the infrared image capture device 100 in the present embodiment is not limited in particular; however, the infrared image capture device 100 in the present embodiment can be used for a night vision device, a heat source searching device, a security device, or a medical equipment, for example.

Figure 2:
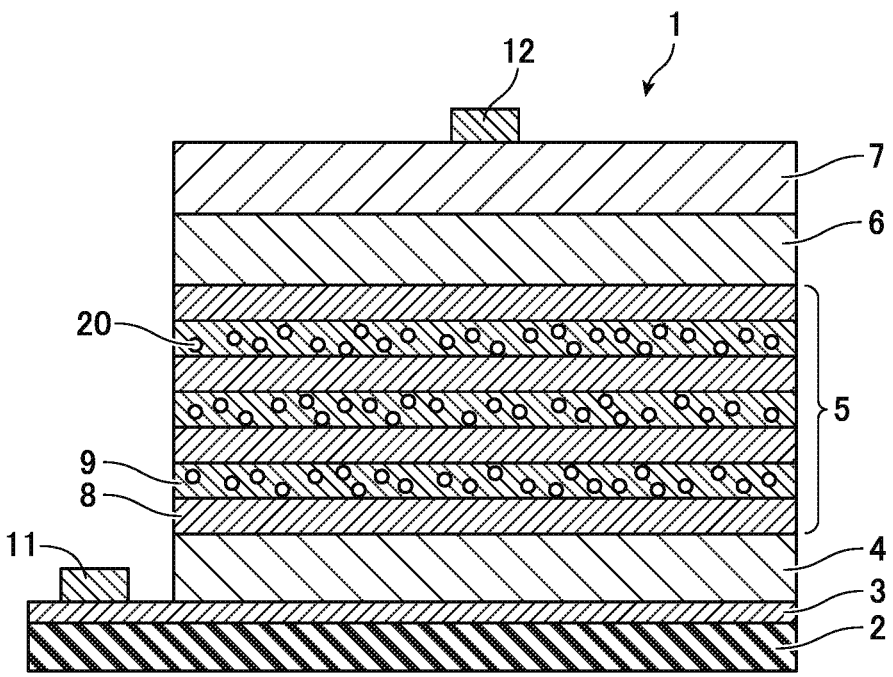
FIG. 2 is a partial cross-sectional view of the infrared sensor according to the present embodiment.

FIG. 2 is a partial cross-sectional view of the infrared sensor according to the present embodiment. As illustrated in FIG. 2, an infrared sensor 1 has a stack structure including, for example, a semi-insulating substrate 2, a first electrode formation layer 3, a first spacer layer 4, a light absorption layer 5, a second spacer layer 6, and a second electrode formation layer 7 in this order from the bottom.

Figure 3:
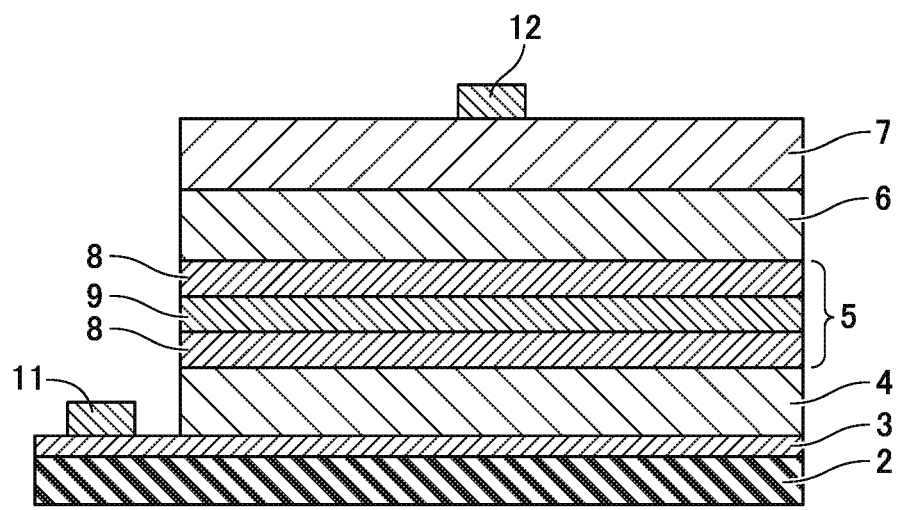
FIG. 3 is a partial cross-sectional view of the infrared sensor according to the present embodiment that is partially different from FIG. 2.

As illustrated in FIG. 2, the light absorption layer 5 has a structure in which intermediate layers 8 and quantum dot layers 9 are stacked alternately. Although the quantum dot layers 9 are formed as a plurality of layers in FIG. 2, the quantum dot layer 9 may be a single layer as illustrated in FIG. 3.

The intermediate layer 8 has a wider band gap than a quantum dot 20 included in the quantum dot layer 9. The quantum dot layer 9 is held between the intermediate layers 8 on the upper and lower sides. For example, as the intermediate layer 8, $Al_yGa_{1-y}As$ ($0 \leq y < 1$) can be used but the material is not limited thereto. As the spacer layers 4 and 6, $Al_zGa_{1-z}As$ ($0 \leq z < 1$) can be used. In a case where the intermediate layer 8 and the spacer layers 4 and 6 are formed of the same material, the intermediate layer 8 and the spacer layers 4 and 6 that are adjacent to each other may be formed as a single layer instead of a two-layer structure. As the semi-insulating substrate 2, for example, a semi-insulating GaAs substrate can be used. On a surface of the semi-insulating GaAs substrate, for example, the first electrode formation layer 3 of n-type GaAs can be formed by being doped with Si.

As illustrated in FIG. 2, for example, on a surface of the first electrode formation layer 3, an emitter electrode 11 is provided and on a surface of the second electrode formation layer 7, a collector electrode 12 is provided.

When the infrared ray is detected, voltage is applied to the light absorption layer 5 from a power source (not shown) through the emitter electrode 11 and the collector electrode 12.

The application of the voltage makes the emitter electrode 11 higher than the collector electrode 12 in terms of energy. Thus, a slope electric field is formed in the light absorption layer 5. When the infrared ray has entered the light absorption layer 5, the electrons bound in the quantum level on the conduction band side of the quantum dot are excited and released. The released electrons move to the collector electrode 12 by the electric field and form photocurrent.

As illustrated in FIG. 2, a plurality of spherical quantum dots 20 are dispersedly disposed in the quantum dot layer 9. Here, the term "spherical" is not limited to the true spherical shape and indicates a shape with a sphericity of 0.7 or more, preferably 0.8 or more, and more preferably 0.9 or more. As for the method of measuring the sphericity, for example, image processing is performed using an electron microscope and from the area and the circumferential length of the observed quantum dot, the sphericity can be calculated by $4\pi \times (area)/(circumferential\ length)^2$. Alternatively, the shape with an aspect ratio, which is expressed by major axis/minor axis of the observed quantum dot, of 1.5 or less, preferably 1.3 or less, and more preferably 1.2 or less is defined as being "spherical".

In the present embodiment, the quantum dot 20 can be formed by liquid-phase synthesis. The quantum dot 20 according to the present embodiment is preferably spherical as described above; however, the quantum dot 20 is not limited to this shape. The quantum dot 20 synthesized by the liquid-phase synthesis method has the spherical shape as described above or may have other shape than the spherical shape. Other examples of the shape that is not spherical include a stick-like shape and a branch-like shape.

For example, in the present embodiment, a resin composition in which the spherical quantum dots 20 are dispersed in resin, and the intermediate layers 8 can be applied alternately and formed. Here, although the resin in which the quantum dots 20 are dispersed is not limited to particular resin, the following resin can be used: polypropylene, polyethylene, polystyrene, AS resin, ABS resin, methacrylic resin, polyvinyl chloride, polyacetal, polyamide, polycarbonate, modified polyphenylene ether, polybutylene terephthalate, polyethylene terephthalate, polysulfone, polyether sulfone, polyphenylene sulfide, polyamide imide, polymethyl pentene, liquid crystal polymer, epoxy resin, phenol resin, urea resin, melamine resin, diallyl phthalate resin, unsaturated polyester resin, polyimide, polyurethane, silicone resin, cyclic olefin polymer (COP), cyclic olefin copolymer (COC), ethylene vinyl alcohol, polymethyl pentene, polyvinylidene fluoride, and the like.

Alternatively, in the present embodiment, the spherical quantum dots 20 that are dissolved in a solvent can be applied by an inkjet method. In this case, the quantum dot layer 9 after the drying is mostly formed of the spherical quantum dots 20 and in this quantum dot layer 9, a small amount of solvent component may be left.

The quantum dot 20 has an emission wavelength of about 800 nm to 1600 nm. As the quantum dot 20 with such an emission wavelength, at least one kind of the following is preferably included: PbS, PbSe, CdHgTe, $Ag_2S$, $Ag_2Se$, $Ag_2Te$, $AgInSe_2$, $AgInTe_2$, $CuInSe_2$, $CuInTe_2$, or InAs. Among these, $Ag_2S$ does not correspond to RoHS. Note that PbS has been reported in the paper of 2003 WILEY-VCH Verlag Gmbh & Co. KGaA. Weinheim. ADVANCED MATERIALS 2003, 15. NO. 21 November 4. In addition, $Ag_2S$ has been reported in the paper of ACS NANO VOL. 6 NO. 5 P3695-3702 (2012).

In the present embodiment, PbS or $Ag_2S$ is preferably used as the quantum dot 20. In addition, by using $Ag_2S$, $Ag_2Se$, $Ag_2Te$, $AgInSe_2$, or $AgInTe_2$ as the quantum dot 20, the fluorescence half-width in a near-infrared region can be narrowed and near-infrared fluorescence with high luminance can be exhibited.

In the present embodiment, one kind, or two or more kinds of quantum dots 20 may be used. That is to say, as the quantum dots 20, either the same kind of quantum dots or different kinds of quantum dots may be used.

The quantum dot 20 in the present embodiment is a nanoparticle with a particle diameter of about several nanometers to several tens of nanometers, for example.

Figure 4A:
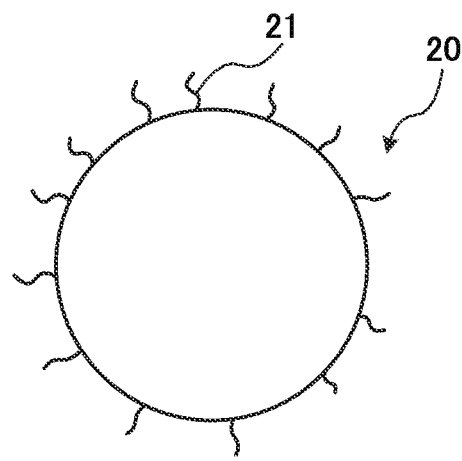
FIG. 4a and FIG. 4b are a schematic view of a quantum dot in the present embodiment.

As illustrated in FIG. 4A, it is preferable that a number of organic ligands 21 are coordinated on a surface of the quantum dot 20. In this case, the aggregation between the quantum dots 20 can be suppressed and the intended optical characteristic can be obtained. The ligand that can be used in the reaction is not limited to a particular ligand and for example, the following ligands are given as typical examples.

(1) Aliphatic Primary Amines

Oleylamines: $C_{18}H_{35}NH_2$, stearyl(octadecyl)amine: $C_{18}H_{37}NH_2$, dodecyl(lauryl)amine: $C_{12}H_{25}NH_2$, decylamine: $C_{10}H_{21}NH_2$, octylamine: $C_8H_{17}NH_2$ (2) Aliphatic Acids Oleic acid: $C_{17}H_{33}COOH$, stearic acid: $C_{17}H_{35}COOH$, palmitic acid: $C_{15}H_{31}COOH$, myristic acid: $C_{13}H_{27}COOH$, lauric acid: $C_{11}H_{23}COOH$, decanoic acid: $C_9H_{19}COOH$, octanoic acid: $C_7H_{15}COOH$ (3) Thiols Octadecane thiol: $C_{18}H_{37}SH$, hexanedecane thiol: $C_{16}H_{33}SH$, tetradecane thiol: $C_{14}H_{29}SH$, dodecane thiol: $C_{12}H_{25}SH$, decane thiol: $C_{10}H_{21}SH$, octane thiol: $C_8H_{17}SH$ (4) Phosphines Trioctyl phosphine: $(C_8H_{17})_3P$, triphenyl phosphine: $(C_6H_5)_3P$, tributyl phosphine: $(C_4H_9)_3P$ (5) Phosphine Oxides Trioctyl phosphine oxide: $(C_8H_{17})_3P=O$, triphenyl phosphine oxide: $(C_6H_5)_3P=O$, tributyl phosphine oxide: $(C_4H_9)_3P=O$ In the present embodiment, it is preferable to use a short ligand as the organic ligand 21. Although the ligand is not limited to a particular ligand, 3-mercaptopropionic acid (MPA) can be used as the organic ligand 21.

The ligand of the quantum dot 20 included in the quantum dot layer 9 is preferably shorter than the ligand when the quantum dot 20 is formed by the liquid-phase synthesis method.

In this manner, by using the short ligand as the ligand of the quantum dot 20 included in the quantum dot layer 9, the roughness of the quantum dot layer 9 can be reduced and the electrons and holes can be extracted with higher efficiency. On the other hand, by using the long ligand when the quantum dot 20 is formed by the liquid-phase synthesis method, the dispersion film forming property can be improved.

Alternatively, the synthesis of the quantum dot 20 with the long ligand by the liquid-phase synthesis method may be followed by the replacement of the composition including the quantum dot 20 with a short ligand (for example, 3-mercaptopropionic acid) after or before the application.

Figure 4B:
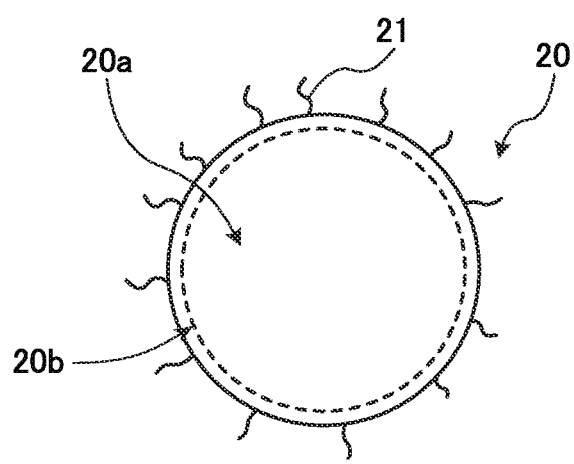

As illustrated in FIG. 4B, the quantum dot 20 may have a core-shell structure including a core 20a and a shell 20b that covers a surface of the core 20a. It is preferable that a number of organic ligands 21 are coordinated on the surface of the quantum dot 20 as illustrated in FIG. 4B. The organic ligand 21 is as already described above. The core 20a of the quantum dot 20 illustrated in FIG. 4B is a nanoparticle illustrated in FIG. 3A. Therefore, the core 20a is formed of the material of the quantum dot 20 described above, for example.

Note that the shell 20b may exist as a solid solution on the surface of the core 20a. In FIG. 4B, the border between the core 20a and the shell 20b is shown by a dotted line, and this means that the border between the core 20a and the shell 20b may be either recognizable or not by the analysis.

The infrared sensor 1 illustrated in FIG. 2 is inverted to form the infrared sensor (QDIP array) 101 whose semi-insulating substrate 2 side faces upward. This infrared sensor 101 is electrically connected onto the circuit board 102 through the bump 104 illustrated in FIG. 1.

Figure 5:
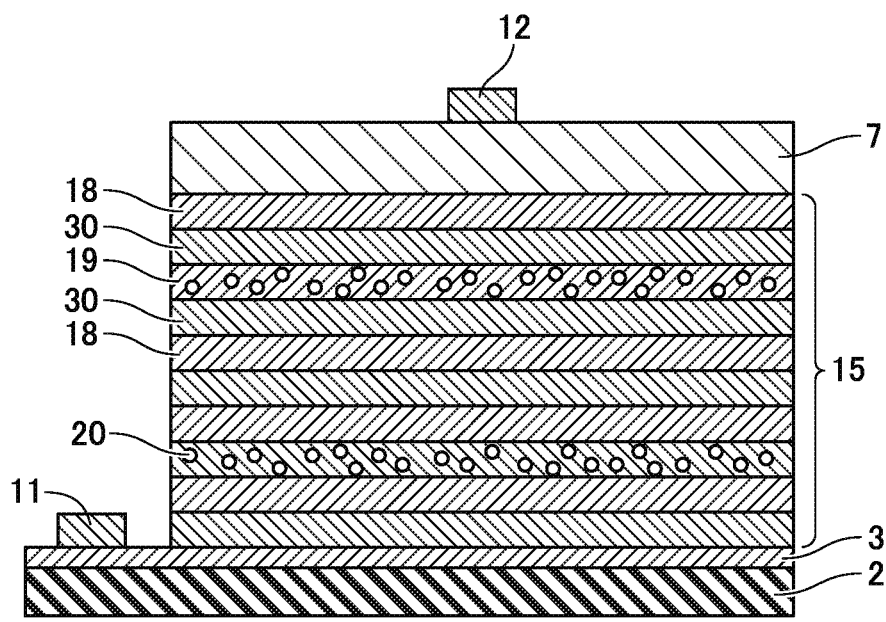
FIG. 5 is a partial cross-sectional view of the infrared sensor according to the present embodiment that is partially different from FIG. 2.

FIG. 5 is a partial sectional view of the infrared sensor according to the present embodiment, which is partially different from FIG. 2. The infrared sensor illustrated in FIG. 5 has a stack structure including the semi-insulating substrate 2, the first electrode formation layer 3, a light absorption layer 15, and the second electrode formation layer 7 in this order from the bottom.

In FIG. 5, the light absorption layer 15 has a stack structure including an intermediate layer 18/a barrier layer 30/a quantum dot layer 19/the barrier layer 30/the intermediate layer 18.

Here, the potential to the carrier in the barrier layer 30 is higher than the potential to the carrier in the intermediate layer 18. In addition, the potential to the carrier in the quantum dot 20 included in the quantum dot layer 19 is lower than the potential to the carrier in the intermediate layer 18. The potential to the carrier in the quantum dot 20 is lower than the potential to the carrier in the barrier layer 30. The band gap of the barrier layer 30 is larger than the band gap of the intermediate layer 18. In addition, the band gap of the quantum dot 20 is smaller than the band gap of each of the intermediate layer 18 and the barrier layer 30.

In a manner similar to FIG. 2, the quantum dot 20 included in the light absorption layer 15 of the infrared sensor illustrated in FIG. 5 is spherical. It is preferable that the quantum dot 20 includes at least one kind of PbS, PbSe, CdHgTe, $Ag_2S$, $Ag_2Se$, $Ag_2Te$, $AgInSe_2$, $AgInTe_2$, $CuInSe_2$, $CuInTe_2$, and InAs.

In a manner similar to FIG. 2, the infrared sensor illustrated in FIG. 5 is inverted to form the infrared sensor (QDIP array) 101 whose semi-insulating substrate 2 side faces upward. This infrared sensor 101 is electrically connected onto the circuit board 102 through the bump 104 illustrated in FIG. 1.

The stack structure illustrated in FIG. 2 and FIG. 5 may be formed in a manner of being divided for each pixel.

As illustrated in FIG. 2 and FIG. 5, in the structure where the plurality of quantum dot layers 9 and 19 are disposed, for example, the layers can be divided into two or more regions of a far-infrared region that detects a far-infrared ray, a middle-infrared region that detects a middle-infrared ray, and a near-infrared region that detects a near-infrared ray. In this structure, the long-wavelength region is disposed on the semi-insulating substrate 2 side, that is, on the light reception surface side. For example, the quantum dot layer including the quantum dot with an emission wavelength in the middle-infrared region is formed in the quantum dot layer with the middle-infrared region, and the quantum dot layer including the quantum dot with an emission wavelength in the near-infrared region is formed in the quantum dot layer with the near-infrared region.

Figure 6:
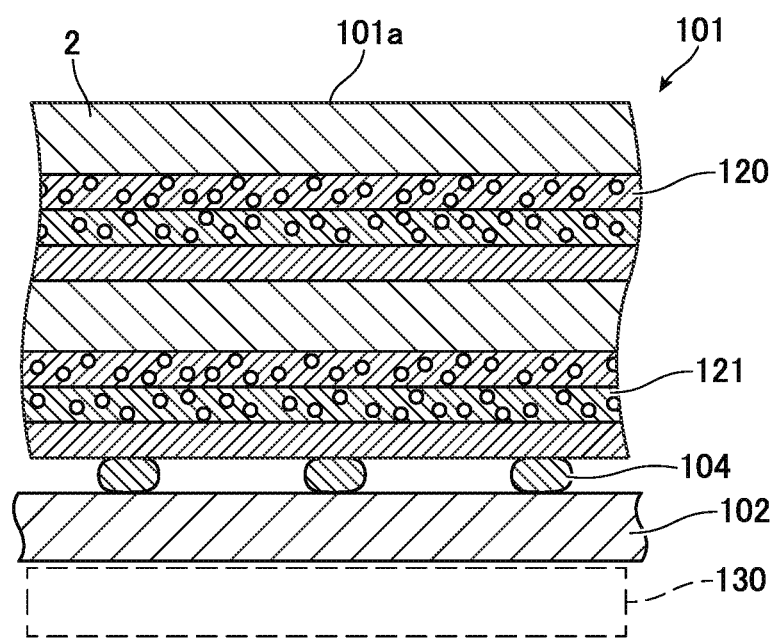
FIG. 6 is a magnified cross-sectional view of a part of the infrared image capture device including the infrared sensor according to the present embodiment.

FIG. 6 is a magnified cross-sectional view of a part of the infrared image capture device including the infrared sensor according to the present embodiment.

In FIG. 6, the infrared sensor 101 includes an infrared detection layer 120 that detects the infrared ray, and a visible light detection layer 121 that detects visible light.

The structure of the infrared detection layer 120 illustrated in FIG. 6 is the stack structure illustrated in FIG. 2 and FIG. 5. In this structure, it is preferable that the quantum dot that is used is spherical and includes at least one kind of PbS, PbSe, CdHgTe, $Ag_2S$, $Ag_2Se$, $Ag_2Te$, $AgInSe_2$, $AgInTe_2$, $CuInSe_2$, $CuInTe_2$, and InAs.

On the other hand, a quantum dot with an emission wavelength in a visible light region is employed as the quantum dot used in the visible light detection layer 121.

Although the structure and the material of the quantum dot are not limited in particular, for example, the quantum dot in the present embodiment is a nanoparticle with a particle diameter of several nanometers to several tens of nanometers.

The quantum dot employed in the visible light region is formed of, for example, Cds-based, CdSe-based, ZnS-based, ZnSe-based, ZnSeS-based, ZnTe-based, ZnTeS-based, InP-based, or chalcopyrite-based (CuInS-based, AgInS-based) quantum dot.

Note that the structure of the quantum dot used in the visible light detection layer 121 may be the structure including the core alone as illustrated in FIG. 4A or the core-shell structure as illustrated in FIG. 4B.

By using the infrared sensor 101 in FIG. 6, not just the infrared ray but also visible light can be detected.

By cooling the quantum dot, the thermal noise can be reduced and the sensitivity can be improved. Therefore, it is preferable to install a cooling device 130 as illustrated in FIG. 6. The place to install the cooling device 130 is not limited to a particular place and may be any place where the quantum dot layer can be cooled properly.

The infrared sensor including the quantum dots according to the present embodiment can confine the carriers firmly, and has the excellent sensitivity to vertical incident light; thus, this infrared sensor is expected as an infrared detector with high sensitivity and low dark current.

Incidentally, the quantum dot layer has conventionally been micro-processed into the island shape. Therefore, the adjustment for the micro-processing is necessary and the manufacturing process becomes complicated easily. In addition, the manufacturing cost easily increases.

On the other hand, the present embodiment provides the structure in which the spherical quantum dot is applied and the micro-processing that has been performed conventionally is no longer necessary; thus, the conventional problem does not occur. Furthermore, for example, the quantum dot formed by the liquid-phase synthesis method (particularly, spherical quantum dot) is used; therefore, the quantum dot has excellent sensitivity in all directions and the variation in sensitivity can be reduced as compared to the conventional micro-processed quantum dot.

In the present embodiment, it is preferable to include at least one kind of PbS, PbSe, CdHgTe, $Ag_2S$, $Ag_2Se$, $Ag_2Te$, $AgInSe_2$, $AgInTe_2$, $CuInSe_2$, $CuInTe_2$, and InAs as the quantum dot. These elements have an emission wavelength of 800 nm to 1600 nm, and are suitably used for the infrared sensor.

In addition, the infrared sensor according to the present embodiment is used for, for example, a photoelectric element or a thermoelectric element that is described below.

Figure 7:
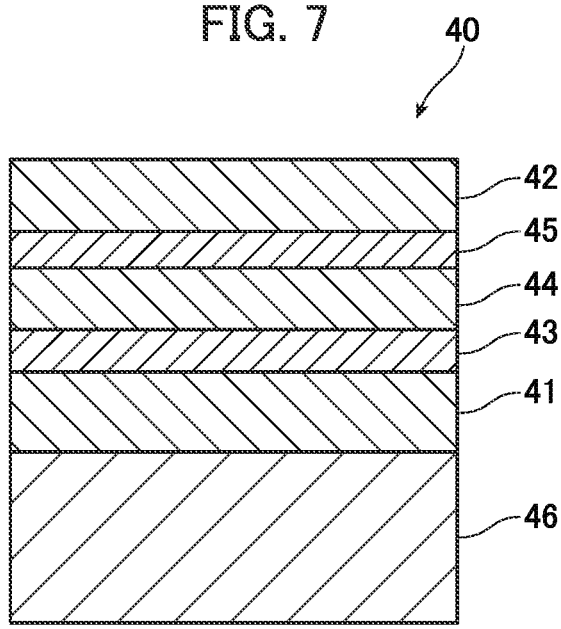
FIG. 7 is a partial cross-sectional view illustrating one example of a photoelectric conversion element according to the present embodiment.
Figure 8:
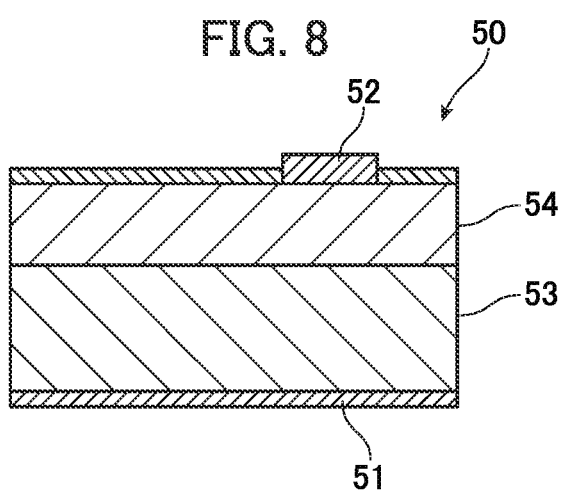
FIG. 8 is a partial cross-sectional view illustrating one example of the photoelectric conversion element according to the present embodiment.
Figures 9A, 9B, 9C, 9D:
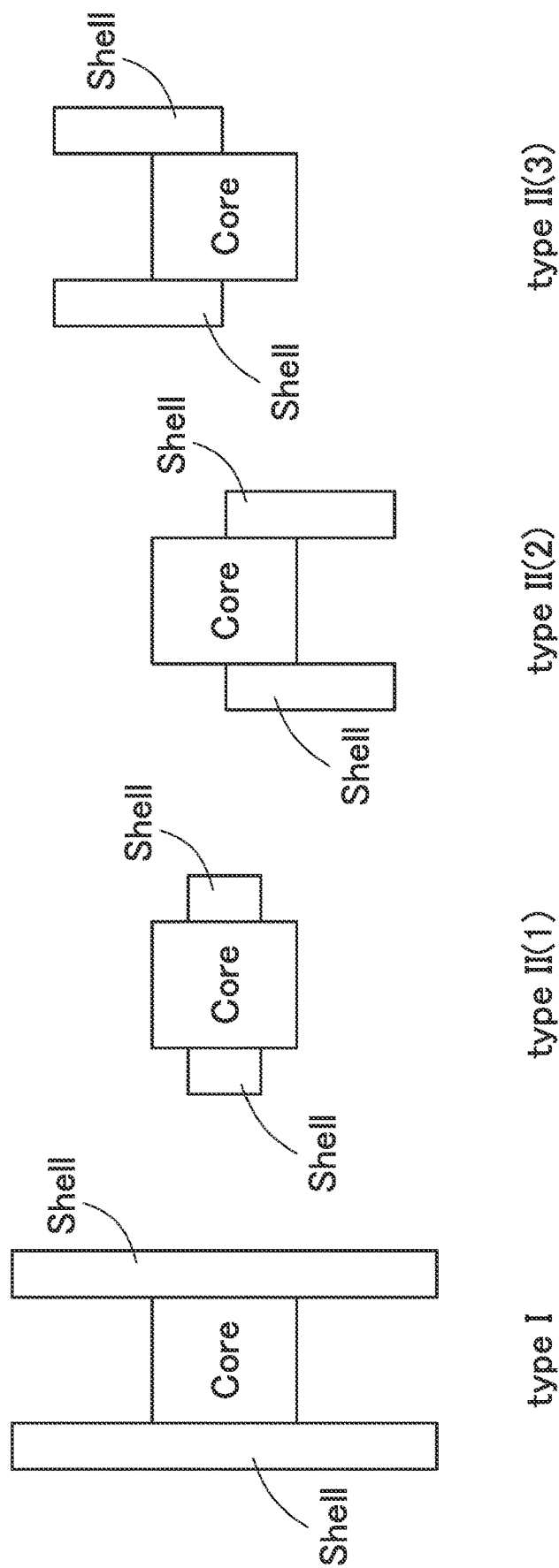
FIG. 9a to FIG. 9D are an energy level diagram in a case where a quantum dot with a core-shell structure is used.

FIG. 7 and FIG. 8 are partial sectional views each illustrating an example of a photoelectric conversion element according to the present embodiment. A photoelectric conversion element 40 illustrated in FIG. 7 includes a first conductive layer 41 that is a cathode and a second conductive layer 42 that is an anode, and also includes an electron transportation layer 43, a light absorption layer 44, and a hole transportation layer 45 between the first conductive layer 41 and the second conductive layer 42. For example, the first conductive layer 41 is formed on a glass substrate 46.

For the electron transportation layer 43, Zno that easily becomes n-ch is preferably used. The light absorption layer 44 is a layer that absorbs light having entered the photoelectric conversion element 40 and generates electrons and holes, and includes the aforementioned spherical quantum dot.

A photoelectric conversion element (PN-type photodiode) 50 illustrated in FIG. 8 includes a P-type semiconductor layer 53 and an N-type semiconductor layer 54 between a first electrode 51 and a second electrode 52. In this manner, the structure includes the electrodes 51 and 52 in the semiconductor with the PN junction, which is similar to a solar cell. The n-type semiconductor includes many electrons that move easily, and some electrons move to the p-type semiconductor to be combined with the holes to cancel the charges, so that a region called a depletion layer is formed. In the n-type semiconductor in the depletion layer, the electrons disappear so that this region is charged to become positive and in the p-type semiconductor, the holes disappear so that this region is charged to become negative; thus, an internal electric field is generated. As the depletion layer is irradiated with light, the electrons and the holes are generated and by the internal electric field, the electrons move to the electrode on the n-type semiconductor side and the holes move to the electrode on the p-type semiconductor side; thus, current flows. Although there is no limitation, the device with the PN junction can be formed in a manner that the spherical quantum dot formed of InAs, which easily becomes p-ch, is used for the P-type semiconductor layer 53 and the spherical quantum dot formed of $Ag_2Te$, which easily becomes n-ch, is used for the N-type semiconductor layer 54.

In the present embodiment, the infrared sensor is usable in an image capture device, the medical field, the communication field, the solar cell, or the like.

In a case where the quantum dot employed in the present embodiment has the core-shell structure, the energy level diagram is as shown in any of FIG. 9A to FIG. 9D. Here, in the case of a light-emitting element, the shell of the core-shell structure is important in improving the quantum confining effect. In particular, a type-I structure illustrated in FIG. 9A (the LUMO of the shell has higher energy than the LUMO of the core, and the HOMO of the shell has lower energy than the HOMO of the core) is preferable.

On the other hand, in the case of using the quantum dot in the photoelectric conversion element, type-II structures are preferable because the carriers (electrons, holes) are easily extracted. In general, since the hole mobility is lower than the electron mobility, it is preferable to select the type II(1) or the type II(3). Note that, in the case of using the quantum dot in the photoelectric conversion element, the quantum dot with the core structure including the ligand can be used instead of the core-shell structure. In the type-II(1), the LUMO of the shell has lower energy than the LUMO of the core and the HOMO of the shell has higher energy than the HOMO of the core. In the type-II(3), the LUMO of the shell has higher energy than the LUMO of the core and the HOMO of the shell has higher energy than the HOMO of the core.

A manufacturing method for the infrared sensor according to the present embodiment includes a step of forming the spherical quantum dot by the liquid-phase synthesis method, and a step of forming the light absorption layer by applying the composition including a plurality of the quantum dots.

In the present embodiment, as the liquid-phase synthesis method, each element source forming the quantum dot is dissolved in a solvent and a precursor solution including each element is subjected to reaction using, for example, a microreactor; thus, the quantum dot particle including a predetermined element can be synthesized. Thus, the spherical quantum dot can be obtained.

In order to disperse the quantum dots more, it is preferable to use a ligand with a long chain. For this purpose, the quantum dot including the ligand with the long chain is preferably used in the application; however, in the manufacture of the device, a ligand with a short chain is preferable in order to extract the carriers (electrons and holes) with higher efficiency. Although not limited, the number of carbons of the ligand with the short chain may be 2 to 5 (preferably 2 to 3) and for example, 3-mercaptopropionic acid can be used as the ligand with the short chain.

In the present embodiment, after the quantum dot is synthesized by the liquid-phase synthesis method, the ligand of the quantum dot can be replaced by the shorter ligand. For example, a composition including the quantum dot (including quantum dot and solvent) is applied using a spin coater. Since the ligand with the long chain is dispersed more, a film with superior roughness can be formed; however, the ligand with the long chain is disadvantageous in terms of carrier extraction. Therefore, for example, after the application, the ligand with the short chain is dropped on the applied film. Accordingly, the ligand with the long chain is replaced by the ligand with the short chain naturally and then, the ligand with the long chain is washed off by cleaning. Alternatively, after the quantum dot is synthesized by the liquid-phase synthesis method and before the application, the ligand with the long chain can be replaced by the ligand with the short chain and then, a composition including the quantum dot (the composition may be a resin composition) can be applied.

INDUSTRIAL APPLICABILITY

The infrared ray can be detected in the present invention. The infrared sensor according to the present invention is applicable to a night vision device, a heat source searching device, a security device, or a medical equipment, for example.

This application is based upon Japanese Patent Application No. 2018-170491 filed on Sep. 12, 2018, the entire contents of all of which are incorporated herein by reference.

The invention claimed is:

1. An infrared image capture device, comprising:
an infrared sensor comprising a light absorption layer that absorbs an infrared ray; and
a circuit board,
wherein the light absorption layer includes quantum dots,
wherein carriers confined in the quantum dots of the light absorption layer in the infrared sensor are excited when the infrared sensor absorbs the infrared ray,
wherein the infrared ray is detected as a photocurrent on the circuit board,
wherein the quantum dots are spherical in shape,
wherein the quantum dots include at least one kind of PbS, PbSe, CdHgTe, $Ag_2S$, $Ag_2Se$, $Ag_2Te$, $AgInSe_2$, $AgInTe_2$, $CuInSe_2$, $CuInTe_2$, and InAs,
wherein ligands are provided on surfaces of the quantum dots, the ligands comprising 3-mercaptopropionic acid,
wherein the light absorption layer comprises intermediate layers that are alternatively stacked with at least one quantum dot layer including the quantum dots,
wherein the intermediate layers have a wider band gap than that of the quantum dots of the at least one quantum dot layer,
wherein each quantum dot layer is sandwiched between two of the intermediate layers that are adjacent to upper and lower sides of each quantum dot layer, and
wherein the at least one quantum dot layer includes a far-infrared region that detects a far-infrared ray, a middle-infrared region that detects a middle-infrared ray, and a near-infrared region that detects a near-infrared ray.

* * * * *